(12) United States Patent
Bagung et al.

(10) Patent No.: US 11,798,873 B2
(45) Date of Patent: Oct. 24, 2023

(54) SEMICONDUCTOR ASSEMBLY

(71) Applicant: VITESCO TECHNOLOGIES GMBH

(72) Inventors: Detlev Bagung, Munich (DE); Thomas Riepl, Munich (DE); Daniela Wolf, Munich (DE); Christina Quest-Matt, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 384 days.

(21) Appl. No.: 16/755,660

(22) PCT Filed: Oct. 5, 2018

(86) PCT No.: PCT/EP2018/077074
§ 371 (c)(1),
(2) Date: Apr. 13, 2020

(87) PCT Pub. No.: WO2019/072694
PCT Pub. Date: Apr. 18, 2019

(65) Prior Publication Data
US 2021/0202366 A1 Jul. 1, 2021

(30) Foreign Application Priority Data

Oct. 12, 2017 (DE) .......................... 102017218273.3

(51) Int. Cl.
*H01L 23/498* (2006.01)
*H01L 23/31* (2006.01)
(Continued)

(52) U.S. Cl.
CPC .... *H01L 23/49838* (2013.01); *H01L 23/3128* (2013.01); *H01L 23/49816* (2013.01);
(Continued)

(58) Field of Classification Search
CPC ........... H01L 23/49838; H01L 23/3128; H01L 23/49816; H01L 24/48; H01L 2224/48227;
(Continued)

(56) References Cited

U.S. PATENT DOCUMENTS 7,148,554 B2 12/2006 Nah et al.
7,372,169 B2 5/2008 Chang
(Continued)

FOREIGN PATENT DOCUMENTS

CN 1835229 A 9/2006
CN 2879422 Y 3/2007
(Continued)

OTHER PUBLICATIONS

Zahn B. A.: "Inverted PCB Heat Slug/Sink for Microelectronic Packages", Motorola Technical Developments, Motorola Inc. Schaumburg, Illinois, US, vol. 33, Dec. 1, 1997 (Dec. 1, 1997), p. 30/31, ISSN 0887-5286, XP000753413.

*Primary Examiner* — Benjamin Tzu-Hung Liu
(74) *Attorney, Agent, or Firm* — Laurence A. Greenberg; Werner H. Stemer; Ralph E. Locher

(57) ABSTRACT

A semiconductor assembly includes a semiconductor component having a redistribution substrate with a top side, an underside and a semiconductor chip on the top side. Contact connection pads for connection to contact pads of the chip are on the top side of the substrate. External contact pads on the underside are electrically connected to the contact connection pads by conductor tracks. The external contact pads are at a greater distance from one another in a first region than a second region of the underside. The semiconductor component is on a printed circuit board. Contact pads corresponding to the external contacts are on a top side of the printed circuit board and are at a greater distance from one another in a first region than a second region of the top (Continued)

side. Through holes are formed between the contact pads in the first region of the printed circuit board.

11 Claims, 2 Drawing Sheets

(51) Int. Cl.
    *H01L 23/00* (2006.01)
    *H05K 1/02* (2006.01)
    *H05K 1/11* (2006.01)
(52) U.S. Cl.
    CPC ............ *H01L 24/48* (2013.01); *H05K 1/0206* (2013.01); *H05K 1/111* (2013.01); *H01L 2224/48227* (2013.01); *H05K 2201/09227* (2013.01); *H05K 2201/10734* (2013.01)
(58) Field of Classification Search
    CPC ................. H05K 1/0206; H05K 1/111; H05K 2201/09227; H05K 2201/10734
    See application file for complete search history.

(56) References Cited

U.S. PATENT DOCUMENTS

| | | | |
|---|---|---|---|
| 7,402,901 B2 | 7/2008 | Hatano et al. | |
| 8,674,505 B2 | 3/2014 | Rhyner et al. | |
| 10,405,417 B2 * | 9/2019 | Viswanathan | H01L 23/3736 |
| 2002/0050380 A1 | 5/2002 | Tanimura et al. | |
| 2003/0132529 A1 * | 7/2003 | Yeo | H01L 23/66 |
| | | | 257/E23.105 |
| 2006/0065972 A1 | 3/2006 | Khan et al. | |
| 2006/0131732 A1 * | 6/2006 | Nah | H05K 1/0206 |
| | | | 257/706 |
| 2006/0170101 A1 | 8/2006 | Kaizuka | |
| 2007/0080456 A1 * | 4/2007 | Chang | H01L 23/49816 |
| | | | 257/E23.07 |
| 2007/0287228 A1 | 12/2007 | Chai et al. | |
| 2009/0115050 A1 | 5/2009 | Kasuya et al. | |
| 2009/0294165 A1 | 12/2009 | Thomas | |
| 2011/0001230 A1 | 1/2011 | Li et al. | |
| 2011/0049710 A1 | 3/2011 | Kao et al. | |
| 2012/0241208 A1 | 9/2012 | Petersen | |
| 2013/0093085 A1 * | 4/2013 | Seah | H01L 24/97 |
| | | | 438/118 |
| 2014/0192583 A1 * | 7/2014 | Rajan | G11C 7/10 |
| | | | 365/63 |
| 2019/0378780 A1 * | 12/2019 | Hauslmann | B33Y 80/00 |

FOREIGN PATENT DOCUMENTS

| | | |
|---|---|---|
| EP | 1672968 A2 | 6/2006 |
| JP | 2006294835 A | 10/2006 |

* cited by examiner

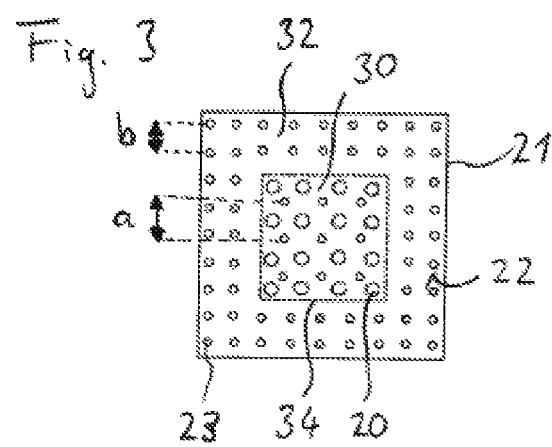

SEMICONDUCTOR ASSEMBLY

BACKGROUND OF THE INVENTION

Field of the Invention

The present invention relates to a semiconductor assembly comprising at least one semiconductor component.

Redistribution substrates, in some instances also called interposers, are used in semiconductor components to enable electrical contact to be made with semiconductor chips via external contacts. Such redistribution substrates can in particular be multilayered and comprise layers of plastic or ceramic, into which conductor tracks are embedded. The conductor tracks connect contact connection pads on the top side of the redistribution substrate to external contact pads on the underside via drilled holes.

US 2011/0001230 A1 discloses a semiconductor component of ball grid array (BGA) design. In the case of semiconductor components of this type, the external contacts in the form of solder balls or solder beads are applied to the external contact pads on the underside of the redistribution substrate. A semiconductor component of this type is soldered onto a superordinate circuit board in a reflow soldering process (occasionally also referred to in German as "Aufschmelz-Lötprozess").

Ball grid array components are widely used and can be produced using cost-effective printed circuit board technologies. What is problematic about such components, however, is that the pitch of the external contact pads and/or external contacts must not become too small, in order that short circuits are prevented. Moreover, in the case of some semiconductor components having an increased cooling demand, regions on the printed circuit board are required for heat dissipation, in particular for linking to a heat sink.

SUMMARY OF THE INVENTION

It is therefore an object of the present invention to specify a semiconductor assembly comprising at least one semiconductor component, which semiconductor assembly has satisfactory routing and contactability and also effective heat dissipation.

This object is achieved by means of a semiconductor assembly having the features described below.

The dependent claims relate to advantageous configurations and developments.

In accordance with one aspect of the invention, a semiconductor assembly comprising at least one semiconductor component is specified, wherein the semiconductor component comprises a redistribution substrate having a top side and an underside and a semiconductor chip arranged on the top side. Contact connection pads for connection to contact pads of the semiconductor chip are arranged on the top side of the redistribution substrate. External contact pads are arranged on the underside, said external contact pads being electrically connected to the contact connection pads via conductor tracks. The external contact pads are arranged at a greater distance from one another in a first region of the underside than in a second region.

Furthermore, the semiconductor assembly comprises at least one printed circuit board on which the semiconductor component is arranged. Contact pads corresponding to the external contacts are arranged on a top side of the printed circuit board, such that contact pads are arranged at a greater distance from one another in a first region of the top side than in a second region.

Through holes are arranged between the contact pads in the first region of the printed circuit board.

Corresponding external contact pads and contact pads are understood here to mean, in particular, that the contact pads are provided for electrical connection to the external contact pads via external contacts and are arranged in the same pattern for this purpose.

The semiconductor assembly has the advantage that good heat dissipating and linking to a heat sink are made possible via the through holes arranged in the first region, which through holes can be embodied in particular as drilled holes. In order to create space for the thermal through holes, the contact pads are arranged with a greater distance (pitch) between one another in the first region. Consequently, in the first region, the number of contact pads provided overall is possibly fewer than has been customary hitherto. However, the electrical functionalities of these contact pads can be shifted into the second region, in which the contact pads are at a smaller distance than one another. This creates enough space between the contact pads to drill the through holes in a mechanical manner, such that the use of cost-intensive microvia technology with laser-drilled holes can be dispensed with.

A cost-effectively producible semiconductor assembly can thus be made available which can achieve an improvement in both the routing and the heat dissipation of a semiconductor component using BGA technology.

In accordance with one embodiment, the external contact pads of the semiconductor component and the corresponding contact pads of the printed circuit board are arranged in rows and columns with a uniform pitch, wherein the pitch in the first region differs from that in the second region and is greater than that.

The through holes extend from the top side of the printed circuit board, on which the semiconductor component is arranged, to the underside of the printed circuit board, which can be connected to a heat sink. The through holes can be embodied as unfilled drilled holes or, for particularly good heat conduction, as copper-filled drilled holes. The heat dissipation is effected in particular via a heat sink on which the printed circuit board is arranged.

This semiconductor assembly has the advantage that it is producible particularly simply and cost-effectively. In particular, the through holes can be drilled in the process for producing the printed circuit board or subsequently, with the result that their number and arrangement can be optimally coordinated with the semiconductor assembly to be optimized.

In accordance with one embodiment, the first region is arranged below a chip mounting region provided on the top side of the redistribution substrate. Most of the heat to be dissipated arises in this region. At the same time, this is also the region which is the least attractive for routing.

The second region can be embodied in particular as a peripheral region of the redistribution substrate and a corresponding region of the printed circuit board. Said peripheral region, which extends all around the chip mounting region at the edge of the redistribution substrate, is particularly important for routing. Electrical contacts are routed from the chip mounting region into said peripheral region via conductor tracks.

External contacts in particular in the form of solder balls or solder columns can be arranged on the external contact pads. The redistribution substrate can be provided in particular for producing a BGA semiconductor component.

The semiconductor chip can be electrically connected to the redistribution substrate for example by means of wire bonding or using flip-chip technology. Connections using flip-chip technology are known in principle to the person skilled in the art and will therefore not be discussed in any greater detail at this juncture.

The semiconductor component has the advantage that it has a particularly good performance as a result of the simultaneous optimization of the routing and the heat dissipation. If necessary, heat-dissipating through holes can also be provided in the redistribution substrate, which through holes can, but need not, correspond to the through holes in the printed circuit board. In this case, it is possible to provide a heat-conducting connection between through holes in the redistribution substrate and through holes in the printed circuit board.

The semiconductor component can be embodied in particular as a BGA component. For components of this type, at the present time for example for applications in control units in the automotive sector, pitches of 1 mm or 0.8 mm are customary, although the latter may be reduced in the future.

The printed circuit board can be in thermal contact with a heat sink, in particular. The heat sink can for example be formed from metal and also constitute a part of a housing of the semiconductor assembly. In an expedient configuration, the heat sink is arranged at an underside of the printed circuit board situated opposite the top side (22). In one configuration, the through holes adjoin the heat sink. In another configuration, the through holes are in thermal contact with the heat sink by means of a thermally conductive paste. In this configuration, the—for example metal-filled—through holes and the heat sink preferably adjoin the thermally conductive paste at opposite sides.

The semiconductor assembly can be in particular a control unit, for example a control unit for a motor vehicle.

Embodiments of the invention will now be explained in greater detail with reference to the accompanying schematic figures.

BRIEF DESCRIPTION OF THE SEVERAL VIEWS OF THE DRAWING

FIG. 3 schematically shows a view of the underside of a redistribution substrate in accordance with one embodiment of the invention.

DETAILED DESCRIPTION OF THE INVENTION

Figure 1:
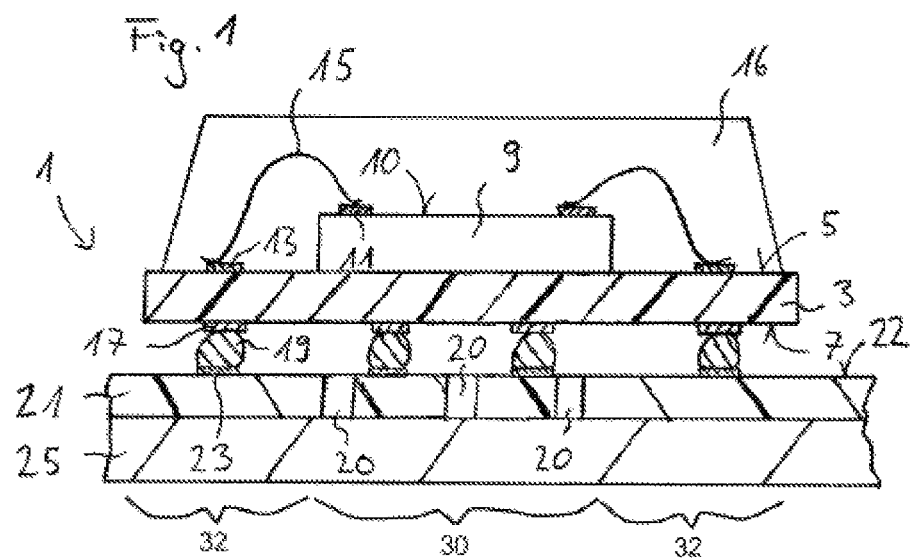
FIG. 1 schematically shows a cross section through a semiconductor component in accordance with a first embodiment of the invention.

The semiconductor component 1 in accordance with FIG. 1 comprises a redistribution substrate 3 having a top side 5 and an underside 7. A semiconductor chip 9 having an active top side 10 is arranged on the top side 5 of the redistribution substrate 3. Contact pads 11 are arranged on the top side 10, said contact pads being electrically connected to contact connection pads 13 on the top side 5 of the redistribution substrate 3 via bond wires 15. The top side 5 of the redistribution substrate 3, the semiconductor chip 9 and also the bond wires 15 are embedded into a plastics housing compound 16, which protects them from environmental influences.

External contact pads 17 are arranged on the underside 7 of the redistribution substrate 3, said external contact pads being electrically connected to the contact connection pads 13 on the top side 5 of the redistribution substrate 3 via conductor tracks (not shown). External contacts 19 in the form of solder balls are arranged on the external contact pads 17. The semiconductor component 1 is thus embodied as a BGA component and comprises a matrix composed of plastic, in which the conductor tracks are arranged.

The semiconductor component 1 is soldered onto a printed circuit board 21 in order to form a semiconductor assembly. To that end, in a reflow process, the external contacts 19 are soldered onto contact pads 23 of the printed circuit board 21. In the embodiment shown, the printed circuit board 21 is in thermal contact with a heat sink 25 by way of a TIM (thermal interface material), not shown.

For dissipating heat from the semiconductor assembly, i.e. for dissipating heat produced by the semiconductor chip 9, through holes 20 are provided in the printed circuit board 21. In the embodiment shown in FIG. 1, through holes 20 of this type are provided only in a first region 30 below the semiconductor chip 9. If necessary, however, through holes can also be provided outside this region. The heat dissipated by the through holes 20 is dissipated by heat conduction in the heat sink 25.

Figure 2:
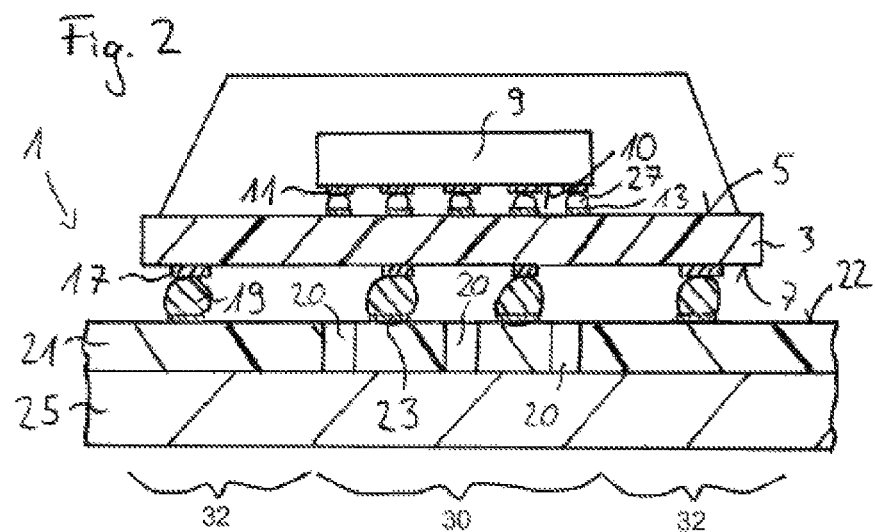
FIG. 2 schematically shows a cross section through a semiconductor component in accordance with a second embodiment of the invention.

FIG. 2 shows a second embodiment of the semiconductor component 1 in accordance with FIG. 1, which differs from that shown in FIG. 1 merely in that the semiconductor chip 9 is connected to the redistribution substrate 3 using flip-chip technology rather than wire bond technology.

To that end, the semiconductor chip 9 has contact pads 11 on its active top side 10, said contact pads being electrically connected to contact connection pads 13 on the top side 5 of the redistribution substrate 3 via flip-chip contacts 27.

FIG. 3 shows a view of the top side 22 of the printed circuit board 21 in accordance with FIGS. 1 and 2. This view reveals that the contact pads 23 are not applied with the same pitch everywhere.

In a first region 30 of the printed circuit board 21, said first region corresponding to a first region 30 of the redistribution substrate 3 and lying below the chip mounting region 34 indicated by the dashed line, the individual contact pads 23 are at a distance a from one another. In a second region 32, which corresponds to a peripheral region of the redistribution substrate 3, the contact pads 23 are at a distance b from one another. The distance a is greater than the distance b.

The contact pads 23 are thus further away from one another in the first region 30 than in the second region 32. This creates space between adjacent contact pads 23 in the first region 30, such that through holes 20 can be positioned in each case between the contact pads 23.

In this case, the through holes 20, as shown in FIG. 3, can likewise be arranged in rows and columns in a grid, wherein a through hole 20 is arranged in each case in the center of four contact pads 23 arranged in a square with respect to one another. The pitch with which the through holes 20 are arranged thus corresponds to the pitch a of the external contacts 19 and/or contact pads 23.

In the embodiment shown, the through holes 20 are arranged only in the first region 30 of the printed circuit board 21 because the greatest demand for heat dissipation is present here. However, through holes 20 can also be positioned outside the first region 30.

In the embodiment shown, the distance between through holes 20 and contact pads 23 adjacent thereto is not only less than the distance a but also less than the distance b. Since no external contacts are arranged on the through holes 20 and undesired short circuits cannot occur, the distance to adjacent contact pads 23 can be comparatively small. Consequently, a sufficient number of through holes 20 for effective heat dissipation can be arranged on a limited area.

The invention claimed is:

1. A semiconductor assembly, comprising:
at least one semiconductor component including a redistribution substrate and a semiconductor chip, said redistribution substrate having an underside with first and second regions and a top side, said semiconductor chip disposed on said top side of said redistribution substrate and said semiconductor chip having contact pads;
contact connection pads disposed on said top side of said redistribution substrate for connection to said contact pads of said semiconductor chip;
external contact pads disposed on said underside of said redistribution substrate, said external contact pads being electrically connected to said contact connection pads by conductor tracks;
said external contact pads disposed at a greater distance from one another in said first region than in said second region of said underside of said redistribution substrate;
at least one printed circuit board, said semiconductor component disposed on said at least one printed circuit board, said at least one printed circuit board having a top side with first and second regions and an underside disposed opposite said top side, and contact pads disposed on said top side of said printed circuit board corresponding to said external contact pads, said contact pads disposed at a greater distance from one another in said first region than in said second region of said top side; and
a heat sink being disposed at said underside of said at least one printed circuit board and being in thermal contact with said underside of said at least one printed circuit board;
said first region of said at least one printed circuit board having through holes formed therein between said contact pads, said through holes adjoining said heat sink and said through holes all being mutually parallel, continuous and straight over an entire length of said through holes, said through holes having a spacing to adjacent ones of said contact pads in said first region being less than a spacing between said contact pads in said second region.

2. The semiconductor assembly according to claim 1, wherein said external contact pads of said redistribution substrate and said corresponding contact pads of said printed circuit board are disposed in rows and columns with a uniform pitch, and said pitch in said first region differs from and is greater than said pitch in said second region.

3. The semiconductor assembly according to claim 2, wherein said through holes are disposed in rows and columns in respective interspaces between said contact pads of said printed circuit board.

4. The semiconductor assembly according to claim 1, wherein said through holes are unfilled drilled holes.

5. The semiconductor assembly according to claim 1, wherein said through holes are drilled holes being wholly or partly filled with copper or a copper alloy.

6. The semiconductor assembly according to claim 1, wherein said top side of said redistribution substrate has a chip mounting region, and said first region is disposed below said chip mounting region.

7. The semiconductor assembly according to claim 1, wherein said second region is a peripheral region of said redistribution substrate.

8. The semiconductor assembly according to claim 1, which further comprises external contacts disposed on said external contact pads of said redistribution substrate.

9. The semiconductor assembly according to claim 8, wherein said semiconductor component is a ball grid array component.

10. The semiconductor assembly according to claim 1, wherein said through holes are in thermal contact with said heat sink through a thermally conductive paste.

11. A semiconductor assembly, comprising:
at least one semiconductor component including a redistribution substrate and a semiconductor chip, said redistribution substrate having an underside with first and second regions and a top side, said semiconductor chip disposed on said top side of said redistribution substrate and said semiconductor chip having contact pads;
contact connection pads disposed on said top side of said redistribution substrate for connection to said contact pads of said semiconductor chip;
external contact pads disposed on said underside of said redistribution substrate, said external contact pads being electrically connected to said contact connection pads by conductor tracks;
said external contact pads disposed at a greater distance from one another in said first region than in said second region of said underside of said redistribution substrate;
at least one printed circuit board, said semiconductor component disposed on said at least one printed circuit board, said at least one printed circuit board having a top side with first and second regions and an underside disposed opposite said top side, and contact pads disposed on said top side of said printed circuit board corresponding to said external contact pads, said contact pads disposed at a greater distance from one another in said first region than in said second region of said top side; and
a heat sink being disposed at said underside of said at least one printed circuit board and being in thermal contact with said underside of said at least one printed circuit board;
said first region of said at least one printed circuit board having through holes formed therein between said contact pads, said through holes adjoining said heat sink and said through holes all being mutually parallel, continuous and straight over an entire length of said through holes, said through holes having a spacing to adjacent ones of said contact pads in said first region being less than a spacing between said contact pads in said second region, said first region being defined by a footprint of said chip and said through holes are only provided in said first region.

* * * * *